United States Patent
Kinner et al.

(10) Patent No.: US 7,247,560 B1
(45) Date of Patent: Jul. 24, 2007

(54) SELECTIVE DEPOSITION OF DOUBLE DAMASCENE METAL

(75) Inventors: Samuel Kinner, Eaton, OH (US); Gary Poovey, Escalon, CA (US)

(73) Assignee: Gary Neal Poovey, Escalon, CA (US)

( * ) Notice: Subject to any disclaimer, the term of this patent is extended or adjusted under 35 U.S.C. 154(b) by 0 days.

(21) Appl. No.: 11/364,654

(22) Filed: Mar. 1, 2006

(51) Int. Cl.
*H01L 21/4763* (2006.01)
(52) U.S. Cl. ............... 438/641; 438/674; 438/675; 438/687; 257/E21.579; 257/E21.586
(58) Field of Classification Search ........... 438/641, 438/674, 675, 687
See application file for complete search history.

(56) References Cited

U.S. PATENT DOCUMENTS

| 6,261,954 | B1 | 7/2001 | Ho et al. | |
|---|---|---|---|---|
| 6,716,743 | B2 | 4/2004 | Nagashima | |
| 6,815,336 | B1 | 11/2004 | Shue et al. | |
| 2004/0000489 | A1* | 1/2004 | Zhang et al. | 205/118 |
| 2004/0164419 | A1* | 8/2004 | Ahn et al. | 257/758 |
| 2006/0046455 | A1* | 3/2006 | Nitta et al. | 438/597 |
| 2006/0115983 | A1* | 6/2006 | Fujii et al. | 438/640 |

* cited by examiner

*Primary Examiner*—Trung Dang

(57) ABSTRACT

A method has been disclosed that allows the selective deposition of the metal for double damascene silicon wafer processing. This selective deposition allows the metal to be deposited only in the via holes, contact holes, channels or where ever the deposition is targeted to be deposited on the wafer where it is needed. This method allows double damascene wafers to be processed with out the necessity of polishing back the whole surface of the wafer to remove metal from most of the wafer surface, as is currently the practice.

9 Claims, 1 Drawing Sheet

SELECTIVE DEPOSITION OF DOUBLE DAMASCENE METAL

BACKGROUND OF THE INVENTION

1. Field of the Invention

This invention relates to a method for selectively depositing metal (usually copper) in structures for silicon wafer semiconductor structures.

2. Description of the Prior Art

The double damascene process has allowed copper to be used for the wires on semiconductor wafers instead of aluminum. Copper cannot be efficiently plasma etched as aluminum was. The wafer is etched with grooves in the oxide coating for the wires that will connect devices once the process is complete. Holes are etched in the bottom of the grooves to make contact with the devices in the layer of the wafer below. The wafer is coated with copper so that the copper fills the grooves and holes. The copper coating is polished back to reveal the damascene wires that make contact with the layers below because the copper is filling the holes that go down to that layer.

U.S. Pat. No. 6,261,954 B1 by Paul Ho et. al., which teaches a METHOD TO DEPOSIT A COPPER LAYER focuses on depositing a good layer of copper for the double damascene process. The use of polar organic solvents in the aqueous copper solution to deposit a good layer is discussed in this patent. The wasteful coating of the whole wafer with copper is explained so that a majority of the copper that is deposited will have to be polished off to reveal the double damascene structure.

U.S. Pat. No. 6,716,743 B2 by Naoki Nagashima which teaches a METHOD OF MANUFACTURING A SEMICONDUCTOR DEVICE employs a second barrier layer over the copper to allow the double damascene pattern to be made with no cupping of the top of the copper surface. The method employs a covering layer of the barrier material usually titanium nitride or tantalum nitride to allow the surface of the copper to be polished without cupping. Still much copper is wasted in the process because the whole surface of the wafer is coated with copper and then it is polished back to reveal the double damascene structure.

U.S. Pat. No. 6,815,336 by Shau-Lin Shue and Syun-Ming Jang which teaches PLANARIZATION OF COPPER DAMASCENE USING REVERSE CURRENT ELECTROPLATING AND CHEMICAL MECHANICAL POLISHING uses a photo resist mask that exposes unneeded copper that is removed by reverse current electroplating. Still, much copper is wasted because the whole wafer must be coated with copper before this process can reduce the amount of copper polished off.

At present in double damascene patterning of a wafer the oxide is patterned with photo resist and the via holes or contact holes are etched to the layer below. Then the photo resist is removed and the oxide is patterned with photo resist and the channels that will be where the wires will be for the metal layer are etched. Then the photo resist is removed and the metal is put all over the wafer first the barrier layer and then the copper. Then the wafer is polished back to reveal the metal lines imbedded in the oxide layer using chemical mechanical polishing (CMP) processes. This requires that most of the metal put on the wafer be polished off. Only the metal in the via holes, contact holes, and metal lines is left on the wafer. What a waste. If the metal could be grown only in the places that it is needed, this would save several steps of the process.

SUMMARY OF THE INVENTION

The present invention, which teaches SELECTIVE DEPOSITION OF DOUBLE DAMASCENE METAL, uses the photo resist that patterns the wafer for the channels that will be the wires of the metal layer. This layer is not removed before the metal is deposited on the wafer. The photo resist mask is used as a positively charged electrode in a selective deposition process that only lets metal deposit on the wafer where it is needed. Metal ions in solution are charged positively. The positively charged photo resist mask repels the metal ions. The metal ions are attracted to a negative charge on the wafer surface, and the electrons that they gather from the negative surface reduce them out of the solution into neutral solid metal atoms on the surface. The photo resist mask will be connected to the positive pole of the electrical source to repel the metal ions from the rest of the wafer surface. In this way, the metal will only be deposited in the via holes, contact holes, channels, or where ever the deposition is targeted to be deposited on the wafer. The metal will not have to be removed from the whole surface of the wafer. After the selective deposition of the metal, the photo resist will be stripped off. The metal layer is then ready for usage. The metal was not deposited to cover the whole surface of the wafer, and it does not require most of the copper to be polished off to reveal the copper in the channels, contact holes, and via holes.

BEST MODE FOR CARRYING OUT THE INVENTION

Figure 1:
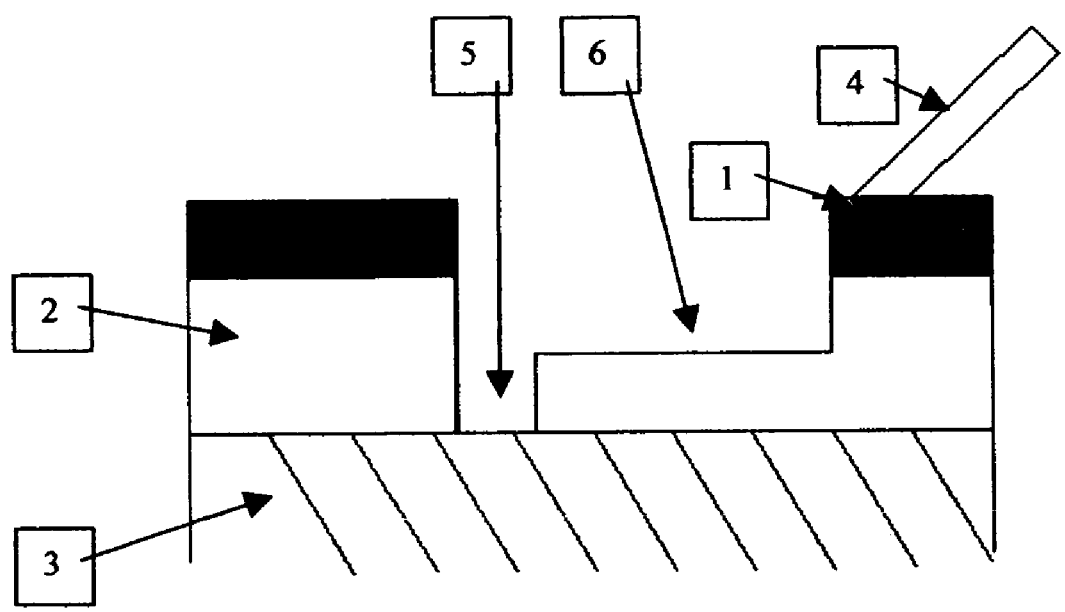
FIG. 1 pictures a schematic cross section of a double damascene wafer ready for selective deposition of the metal layer.

As FIG. 1 shows, in schematic form, the cross section of a wafer, which is ready for selective deposition of the metal layer. This is the cross section of the wafer once the etching of the channels, contact holes, and via holes is complete. Without stripping the resist, the selective deposition of the copper can be done. The photo resist is labeled 1. The photo resist can be chosen for its electrically conductive properties or it may be treated with an argon glow to make carbon atom to carbon atom connections sufficient to bring the photo resist to be sufficiently conductive for the selective deposition usage. The photo resist can be exposed to a chemical bath to render it conductive as well. The silicon oxide or electrically insulating layer is labeled 2. This layer is etched to reveal the device layer below. The silicon oxide layer is etched through to the layer below shown schematically in what is labeled 5. The holes etched through to the first layer of devices are called contact holes. The holes etched trough to allow electrical contact with layers above the first are called via holes. The channels etched in the insulating layer (usually silicon oxide) that will provide wires on the surface of the wafer to connect the devices of the wafer once they are filled with metal is labeled in the drawing with a 6. In the drawing, that which is labeled 3 is the device layer below the double damascene metal layer. This layer has devices in it that must be connected by way of the double damascene metal lines to the other layers and each other. The power to run the devices comes through the double damascene metal lines. The double damascene metal lines are also the wires to take information in and out of the layer. In FIG. 1, the electrical contact to the photo resist is labeled 4. This contact will allow a positive charge to be put on the photo resist. The positive charge will prevent the metal from depositing on it by repelling the positive metal ions in the selective deposition solution. The silicon of the wafer under the device layer 3 is connected to a negative charge to foster the deposition of the metal in the channels, contact holes, and via holes of the wafer. The metal is not deposited on the entire surface of the wafer as is it is in the current double non-selective damascene process.

What we claim as our invention is:

1. A process for deposition of copper on semiconductor wafers that selectively deposits metal only on the surfaces that the metal will remain involving the steps of:
    using a conductive photo resist mask to pattern an insulating layer that is etched for metal lines to be patterned is left on the wafer;
    attaching a positive electrical lead to the photo resist mask that patterns the insulating layer so that little or no metal will be deposited where the photo resist mask is present;
    attaching a negative electrical lead to the wafer so that the metal deposition only occurs in an electro plating bath in via holes, contact holes, channels or other targeted areas for electrical connection of devices;
    immersing the wafer in the metal electroplating bath;
    taking wafer out of the metal electroplating bath once the desired thickness of metal is deposited; and
    removing the photo resist mask.

2. A process for selectively depositing metal on semiconductor wafers as is claimed in claim 1 where the photo resist mask must be treated by a plasma exposure to be sufficiently conductive.

3. A process for selectively depositing metal on semiconductor wafers as is claimed in claim 1 where the photo resist mask must be treated by a chemical bath to be sufficiently conductive.

4. A process for selectively depositing metal on semiconductor wafers as claimed in claim 1 where the photo resist mask has been chosen to be sufficiently conductive.

5. A process for selectively depositing metal on semiconductor wafers as claimed in claim 1 where the metal deposited is copper.

6. A process for selectively depositing metal on semiconductor wafers as claimed in claim 1 where the photo resist mask is partially removed before the process is started.

7. A process for selectively deposition of metal on semiconductor wafers as claimed in claim 1 where the photo resist mask is removed and the pattern is redone replacing the original pattern.

8. A process is claimed in claim 1 where the positive charge on the photo resist mask repels the positive metal ions.

9. A process is claimed as in claim 1 where a negative charge is put on the photo resist mask to repel negative ions that carry the material that will be deposited on the wafer surface.

* * * * *